United States Patent
Tanaka et al.

(10) Patent No.: US 7,790,533 B2
(45) Date of Patent: Sep. 7, 2010

(54) LASER IRRADIATION METHOD, LASER IRRADIATION APPARATUS, AND METHOD FOR MANUFACTURING SEMICONDUCTOR DEVICE

(75) Inventors: Koichiro Tanaka, Isehara (JP); Yoshiaki Yamamoto, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 774 days.

(21) Appl. No.: 10/582,614

(22) PCT Filed: Jun. 15, 2005

(86) PCT No.: PCT/JP2005/011401
§ 371 (c)(1),
(2), (4) Date: Jun. 12, 2006

(87) PCT Pub. No.: WO2005/124842
PCT Pub. Date: Dec. 29, 2005

(65) Prior Publication Data
US 2007/0166965 A1    Jul. 19, 2007

(30) Foreign Application Priority Data
Jun. 18, 2004  (JP) ............................. 2004-180574

(51) Int. Cl.
*H01L 21/00* (2006.01)
*H01L 21/84* (2006.01)
(52) U.S. Cl. ..................... 438/166; 438/479; 438/487; 438/689; 257/E21.133; 257/E21.134
(58) Field of Classification Search .................. 438/166, 438/479, 487, 689; 257/E21.133, E21.134
See application file for complete search history.

(56) References Cited

U.S. PATENT DOCUMENTS
2002/0137342 A1* 9/2002 Ishida et al. ................. 438/689
2003/0025118 A1* 2/2003 Yamazaki et al. .............. 257/79

FOREIGN PATENT DOCUMENTS
JP      07-094171          10/1995
JP      2003-228034         8/2003
JP      2003228034 A  *     8/2003

OTHER PUBLICATIONS
International Search Report (Application No. PCT/JP2005/011401) dated Oct. 4, 2005.
Written Opinion (Application No. PCT/JP2005/011401) dated Oct. 4, 2005.

* cited by examiner

*Primary Examiner*—Alexander G Ghyka
*Assistant Examiner*—Abdulfattah Mustapha
(74) *Attorney, Agent, or Firm*—Eric J. Robinson; Robinson Intellectual Property Law Office, P.C.

(57) ABSTRACT

The present invention is to provide a technique that can increase productivity with high output power by combining a plurality of laser beams on an irradiation surface without any difficulties in optical alignment. According to this technique, laser beams having different wavelengths are combined using a plurality of laser oscillators and a dichroic mirror, or additionally a polarizer. For example, a first laser beam emitted from a first laser oscillator is combined with a second laser beam emitted from a second laser oscillator having different wavelength from the first laser beam in such a way that the first laser beam passes through a dichroic mirror and the second laser beam is reflected on the dichroic mirror, and the combined laser beam is projected to an irradiation surface.

8 Claims, 10 Drawing Sheets

LASER IRRADIATION METHOD, LASER IRRADIATION APPARATUS, AND METHOD FOR MANUFACTURING SEMICONDUCTOR DEVICE

TECHNICAL FIELD

The present invention relates to a technique for combining three or more laser beams on an irradiation surface without any difficulties in optical alignment. More specifically, the present invention relates to laser irradiation method and apparatus for combining three or more laser beams on an irradiation surface without any difficulties in optical alignment to enhance productivity with high output power. Further, the present invention relates to a crystallizing method and a method for manufacturing a semiconductor device with the use of a laser beam which is obtained by combining at least two laser beams.

BACKGROUND ART

In recent years, a technique to manufacture a thin film transistor (hereinafter referred to as a TFT) over a substrate has made a great progress, and application to an active matrix display device has been advanced. In particular, a TFT formed using a poly-crystalline semiconductor film is superior in field-effect mobility to a TFT formed using a conventional amorphous semiconductor film; therefore, high-speed operation is possible with the TFT formed using the poly-crystalline semiconductor film. For this reason, it has become possible that a circuit for driving a pixel, which has been mounted by an external IC chip, is formed over the same substrate as the pixel by using a TFT.

A substrate used in a semiconductor device is expected to be a glass substrate rather than a quartz substrate in terms of cost. However, the glass substrate is inferior in heat resistance and easy to deform due to the heat. Therefore, when the TFT using the poly-crystalline semiconductor film is formed over the glass substrate, laser annealing is employed to crystallize a semiconductor film in order to prevent the glass substrate from deforming due to the heat.

Compared with another annealing method which uses radiant heat or conductive heat, the laser annealing has advantages that the processing time can be shortened drastically and that a semiconductor substrate or a semiconductor film over a substrate can be heated selectively and locally so that almost no thermal damage is given to the substrate. The laser annealing method described here indicates a technique to crystallize an amorphous layer or a damaged layer formed in a semiconductor substrate or a semiconductor film, a technique to crystallize an amorphous semiconductor film formed over a substrate, and a technique to heat (anneal) a non-single crystal semiconductor film. Further, a technique applied to planarization or modification of the surface of the semiconductor substrate or the semiconductor film is also included.

The laser annealing often employs a laser beam emitted from an excimer laser. The excimer laser has advantages of high output power and capability of repetitive irradiation at high frequency. Further, the laser beam emitted from the excimer laser has another advantage of high absorption coefficient to a silicon film, which is often used as a semiconductor film. As an irradiation method of the laser beam, the following method has high productivity and is superior industrially: a laser beam emitted from an excimer laser or the like that has high output power is shaped into a linear spot on an irradiation surface by an optical system and then the irradiation position of the laser beam is moved in a minor-axis direction of the linear laser beam relative to the irradiation surface. Currently, a technique for manufacturing a liquid crystal display by forming TFTs including a semiconductor film annealed by the above method has been widely carried out.

The laser beam emitted from the excimer laser is not a continuous wave; however, a continuous wave laser beam is also applicable. In this case, when the continuous wave laser beam (hereinafter referred to as a CW laser) is shaped into a linear spot and the irradiation position of the laser beam is moved in its minor-axis direction relatively, and a large grain crystal extended in the moving direction of laser beam is formed. When a channel forming region of a TFT is manufactured in accordance with a major-axis direction of the large grain crystal, it is possible to manufacture a TFT having higher mobility than a TFT manufactured with the excimer laser. With the TFT having high mobility, circuits such as a driver and a CPU can be driven at high speed.

The laser annealing for the semiconductor film often employs a laser beam having a wavelength in a visible range or an ultraviolet range because the absorption efficiency to the semiconductor film is high. However, the wavelength emitted from a solid-state laser medium used in a CW laser is usually from red to infrared ranges, which is low in the absorption efficiency to the semiconductor film. Therefore, a non-linear optical element is used to convert the wavelength into a harmonic having a wavelength in the visible range or the ultraviolet range, and the harmonic is used in the laser annealing. The harmonic is obtained by making the fundamental wave emitted from the laser medium enter the non-linear optical element. However, when the output power of the laser is increased, the non-linear optical element is damaged due to the non-linear optical effect such as multi-photon absorption, which may result in the breakdown of the laser oscillator.

For these reasons, the CW laser manufactured currently has a maximum output power as low as approximately 15 W because of the above-mentioned problem in the non-linear optical element. In the case of the laser annealing using the CW laser, the productivity is lower than that when using the excimer laser; therefore, further enhancement of the productivity is required. For example, when crystallization is performed by laser annealing with a linear beam spot having a size of 300 μm in the major-axis direction and 10 μm in the minor-axis direction formed by shaping a CW laser providing 10 W at 532 nm, the width of the large grain crystal obtained by one scanning is approximately 200 μm.

DISCLOSURE OF INVENTION

As thus described, in the laser annealing method using the CW laser, higher output power is difficult to obtain because of the problem in the non-linear optical system. Consequently, in order to increase the productivity, such a technique is simple as combining laser beams emitted from a plurality of laser oscillators and irradiating a substrate with the combined laser beam which is shaped by an appropriate optical system. However, in the case of using laser oscillators having the same wavelength, a polarizer for combining a plurality of beams into one beam can be used only for vertically polarized light and horizontally polarized light. Therefore, only two laser beams can be combined at most (see Reference 1: Japanese Published Examined Application No.: H7-94171). Further, in a technique for combining a plurality of laser beams having different optical axes on an irradiation surface, the optical alignment is difficult because the spot size on the irradiation surface is as small as several μm.

The present inventors have succeeded in making the present invention by making efforts to overcome the above problems. That is to say, it is an object of the present invention to provide a technique for combining three or more laser beams on the irradiation surface without any difficulties in the optical alignment to increase the productivity with high output power. Further, it is an object of the present invention to provide a laser irradiation method and a laser irradiation apparatus for combining three or more laser beams to increase the productivity with high output power and to provide a crystallizing method and a method for manufacturing a semiconductor device which use the irradiation laser beam. In this specification, the combination of laser beams indicates the state where a plurality of laser beams are adjacent to each other to such a degree that the laser beams can be condensed by a condensing lens, and more preferably the state where the laser beams exist on the same optical axis. Moreover, the combination of the laser beams on an irradiation surface indicates the state where the laser beams overlap with each other at least partially on the irradiation surface.

The present invention is to provide a laser irradiation method and a laser irradiation apparatus for combining three or more laser beams on an irradiation surface without any difficulties in optical alignment to increase the productivity with high output power and to provide a crystallizing method and a method for manufacturing a semiconductor device which use the irradiation laser beam. Simply explaining, the present invention relates to a laser irradiation technique to increase the productivity by using laser oscillators having different wavelengths and a dichroic mirror, or additionally a polarizer, to combine laser beams.

A laser irradiation method of the present invention comprises: emitting a first laser beam from a first laser oscillator; emitting a second laser beam from a second laser oscillator; combining the first laser beam with the second laser beam by a dichroic mirror; projecting the combined laser beam to an irradiation surface, the first laser beam passes through the first dichroic mirror and the second laser beam is reflected on the first dichroic mirror, and wavelength of the first laser beam is different from that of the second laser beam.

A laser irradiation method of the present invention comprises: emitting a first laser beam from a first laser oscillator; emitting a second laser beam from a second laser oscillator; emitting a third laser beam from a third laser oscillator; combining the first laser beam with the second laser beam by a first dichroic mirror, thereby forming a first combined laser beam; combining a first combined laser beam with a third laser beam by a second dichroic mirror, thereby forming a second combined laser beam; and projecting the second laser beam to an irradiation surface, the first laser beam passes through the first dichroic mirror and the second laser beam is reflected on the first dichroic mirror, the first combined laser beam passes through the second dichroic mirror and the third laser beam is reflected on the second dichroic mirror, and each wavelength of the first, second, and third laser beams is different.

A laser irradiation method of the present invention comprises: emitting a first laser beam from a first laser oscillator; emitting a second laser beam from a second laser oscillator; emitting a third laser beam from a third laser oscillator; emitting a fourth laser beam from a fourth laser oscillator; combining the first laser beam with the second laser beam by a first dichroic mirror, thereby forming a first combined laser beam; combining the third laser beam with the fourth laser beam by a second dichroic mirror, thereby forming a second combined laser beam; combining the first combined laser beam with the second combined laser beam by a polarizer, thereby forming a third combined laser beam; and projecting the third combined laser beam to an irradiation surface, the first laser beam passes through the first dichroic mirror and the second laser beam is reflected on the first dichroic mirror, the third laser beam passes through the second dichroic mirror and the fourth laser beam is reflected on the second dichroic mirror, the first combined laser beam passes through the polarizer and the second combined laser beam is reflected on the polarizer, wavelength of the first laser beam is different from that of the second laser beam, and wavelength of the third laser beam is different from that of the fourth laser beam.

A laser irradiation method of the present invention comprises: emitting a first laser beam from a first laser oscillator; emitting a second laser beam from a second laser oscillator; emitting a third laser beam from a third laser oscillator; emitting a fourth laser beam from a fourth laser oscillator; emitting a fifth laser beam from a fifth laser oscillator; emitting a sixth laser beam from a sixth laser oscillator; combining the first laser beam emitted with a second laser beam by a first dichroic mirror, thereby forming a first combined laser beam, wherein the first laser beam passes through the first dichroic mirror and the second laser beam is reflected on the first dichroic mirror; combining a first combined laser beam with the third laser beam by a second dichroic mirror, thereby forming a second combined laser beam, wherein the first combined laser beam passes through the second dichroic mirror and the third laser beam is reflected on the second dichroic mirror; combining the fourth laser beam emitted with the fifth laser beam by a third dichroic mirror, thereby forming a third combined laser beam, wherein the fourth laser beam passes through the third dichroic mirror and the fifth laser beam is reflected on the third dichroic mirror; combining the third combined laser beam with the sixth laser beam by a fourth dichroic mirror, thereby forming a fourth combined laser beam, wherein the third combined laser beam passes through the fourth dichroic mirror and the sixth laser beam is reflected on the fourth dichroic mirror; combining the second combined laser beam with the fourth combined laser beam by a polarizer, thereby forming a fifth combined laser beam, wherein the second combined laser beam passes through the polarizer and the fourth combined laser beam is reflected on the polarizer; and projecting the fifth combined laser beam to an irradiation surface, wavelengths of the first, second third laser beams are different from each other, and wavelengths of the fourth, fifth, and sixth laser beams are different from each other.

In the laser irradiation method according to the present invention, the combined laser beam preferably passes through a condensing lens before being projected to the irradiation surface in order to transform the laser beam into a desired shape. As the condensing lens, an achromatic lens or an apochromatic lens is preferable. Further, a crystallizing method according to the present invention is to crystallize a semiconductor film using the combined laser beam. A method for manufacturing a semiconductor device according to the present invention is to crystallize a semiconductor film using the combined laser beam and to manufacture a semiconductor device using the semiconductor film obtained by the crystallization.

A manufacturing method for a semiconductor device according to the present invention comprises: emitting a first laser beam from a first laser oscillator; emitting a second laser beam from a second laser oscillator; combining the first laser beam with the second laser beam by a dichroic mirror; crystallizing a semiconductor film by irradiating the semiconductor film with the combined laser beam, the first laser beam passes through the first dichroic mirror and the second laser beam is reflected on the first dichroic mirror, and wherein wavelength of the first laser beam is different from that of the second laser beam.

A manufacturing method for a semiconductor device according to the present invention comprises: emitting a first laser beam from a first laser oscillator; emitting a second laser beam from a second laser oscillator; emitting a third laser beam from a third laser oscillator; combining the first laser beam with the second laser beam by a first dichroic mirror, thereby forming a first combined laser beam; combining a first combined laser beam a third laser beam by a second dichroic mirror, thereby forming a second combined laser beam; and crystallizing a semiconductor film by irradiating the semiconductor film with the second combined laser, the first laser beam passes through the first dichroic mirror and the second laser beam is reflected on the first dichroic mirror, the first combined laser beam passes through the second dichroic mirror and the third laser beam is reflected on the second dichroic mirror, and wavelengths of the first, second, third laser beams are different from each other.

A laser irradiation apparatus according to the present invention comprises: a first laser oscillator emitting a first laser beam; a second laser oscillator emitting a second laser beam having a different wavelength from the first laser beam; a dichroic mirror for combining the first and second laser beams by transmitting the first laser beam and reflecting the second laser beam; and a stage.

A laser irradiation apparatus according to the present invention comprises: a first laser oscillator emitting a first laser beam; a second laser oscillator emitting a second laser beam having a different wavelength from the first laser beam; a first dichroic mirror for combining the first and second laser beams into a first combined laser beam by transmitting the first laser beam and reflecting the second laser beam; a third laser oscillator emitting a third laser beam having a different wavelength from the first and second laser beams; a second dichroic mirror for combining the third laser beam and the first combined laser beam into a second combined laser beam by transmitting the first combined laser beam and reflecting the third laser beam; and a stage.

A laser irradiation apparatus according to the present invention comprises: a first laser oscillator emitting a first laser beam; a second laser oscillator emitting a second laser beam having a different wavelength from the first laser beam; a first dichroic mirror for combining the first and second laser beams into a first combined laser beam by transmitting the first laser beam and reflecting the second laser beam; a half-wave plate for transmitting the first combined laser beam; a third laser oscillator emitting a third laser beam; a fourth laser oscillator emitting a fourth laser beam having a different wavelength from the third laser beam; a second dichroic mirror for combining the third and fourth laser beams into a second combined laser beam by transmitting the third laser beam and reflecting the fourth laser beam; a polarizer for combining the first and second combined laser beams into a third combined laser beam by transmitting the first combined laser beam and reflecting the second combined laser beam; and a stage.

A laser irradiation apparatus according to the present invention comprises: a first laser oscillator emitting a first laser beam; a second laser oscillator emitting a second laser beam having a different wavelength from the first laser beam; a first dichroic mirror for combining the first and second laser beams into a first combined laser beam by transmitting the first laser beam and reflecting the second laser beam; a third laser oscillator emitting a third laser beam having a different wavelength from the first and second laser beams; a second dichroic mirror for combining the first combined laser beam and the third laser beam into a second combined laser beam by transmitting the first combined laser beam and reflecting the third laser beam; a half-wave plate for transmitting the second combined laser beam; a fourth laser oscillator emitting a fourth laser beam; a fifth laser oscillator emitting a fifth laser beam having a different wavelength from the fourth laser beam; a third dichroic mirror for combining the fourth and fifth laser beams into a third combined laser beam by transmitting the fourth laser beam and reflecting the fifth laser beam; a sixth laser oscillator emitting a sixth laser beam having a different wavelength from the fourth and fifth laser beams; a fourth dichroic mirror for combining the third combined laser beam and the sixth laser beam into a fourth combined laser beam by transmitting the third combined laser beam and reflecting the sixth laser beam; a polarizer for combining the second combined laser beam and the fourth combined laser beam into a fifth combined laser beam by transmitting the second combined laser beam and reflecting the fourth combined laser beam; and a stage.

According to the present invention, it has been succeeded to provide a laser annealing method with a continuous wave laser having a power of approximately 15 W or more and a wavelength in the visible range or the ultraviolet range, which has been considered difficult, by using a dichroic mirror. This has an extremely superior effect. Specifically, the present invention is a laser irradiation technique to increase the productivity with high output power by combining laser beams having wavelengths in the visible or ultraviolet range with the use of laser oscillators having different wavelengths and a dichroic mirror, or additionally a polarizer.

The dichroic mirror is a mirror coated so as to have high reflectivity only against a particular wavelength range. With the dichroic mirror, the laser beams can be combined without considering the polarizing direction. Therefore, two or more laser beams can be combined, which makes it possible to obtain a laser beam having higher power and to increase the productivity. Further, when a polarizer is used in addition to the dichroic mirror, each two laser beams having the same wavelength can be combined. Thus, the productivity can be further increased.

More specifically, because of high absorption efficiency to a semiconductor film, a laser beam having a wavelength in the visible or ultraviolet range is often used to anneal the semiconductor film. However, a laser beam emitted from a solid-state laser medium which is used in a CW laser generally has a wavelength in a red to near-infrared range, which is low in the absorption efficiency to the semiconductor film. Therefore, the laser beam is converted into a harmonic having a visible or ultraviolet wavelength using a non-linear optical element. This conversion is conducted by making a fundamental wave emitted from the laser medium enter the non-linear optical element. However, as the output power of the laser increases, the non-linear optical element is damaged due to the non-linear optical effect such as multi-photon absorption, which may result in the breakdown of the laser oscillator. For this reason, a CW laser manufactured currently which emits the visible laser beam has a maximum output power as low as 15 W because of the problem in the non-linear optical element.

In order to avoid this problem, a simple technique is given in which laser beams are combined by using a plurality of laser oscillators and the combined laser beam is shaped by any optical system to increase the productivity. Even in this case, when the laser oscillators having the same wavelength are used, a polarizer can only combine vertically polarized light and horizontally polarized light; therefore, only two laser beams can be combined at most. On the other hand, the present invention is to use a dichroic mirror to combine the laser beams. With the dichroic mirror, three or more laser beams can be combined and a laser beam having high output power and a visible or ultraviolet wavelength can be provided. Further, by using the polarizer in addition to the dichroic mirror, two laser beams having the same wavelength can be combined. Thus, a laser beam having higher output power can be provided, and the productivity can be increased.

As a result, according to the present invention, the combined laser beam having the high output power and the visible or ultraviolet wavelength is shaped into a linear beam and delivered to a semiconductor film. By moving the linear beam, a large grain crystal, which is a crystal grain extending long in the moving direction of the linear beam, can be manufactured. Further, when a channel forming region of a TFT is manufactured in accordance with a major-axis direction of the large grain crystal, a TFT having higher mobility than a TFT manufactured with an excimer laser can be obtained. With the TFTs having high mobility, circuits such as a driver and a CPU can be driven at high speed. As thus described, the present invention provides a superior effect.

BEST MODE FOR CARRYING OUT THE INVENTION

Embodiment modes including the best mode for carrying out the present invention are hereinafter described. Although the best mode is described with plural aspects based on the drawings, it is obvious that the present invention is not limited to this but specified by the scope of claims. One of characteristics of the present invention is that laser beams having different wavelengths are combined using a dichroic mirror. Specifically, the laser beams are combined by the dichroic mirror in such a way that one laser beam passes through the dichroic mirror and another laser beam having a different wavelength from the passed laser beam is reflected on the dichroic mirror in the same direction as the passed laser beam.

The dichroic mirror is coated so as to have high reflectivity only against a particular wavelength range. Therefore, the dichroic mirror reflects a beam in the particular wavelength range selectively and transmits a beam in another wavelength. The dichroic mirror can be easily obtained for its availability in the market. The wavelength range reflected by the dichroic mirror is not limited in particular. The wavelength to be reflected can be determined by selecting a material to coat the mirror. For example, a laser beam having a wavelength of 355 nm, 405 nm, 488 nm, 532 nm, 628 nm, or the like can be reflected by selecting the material to coat the mirror. As the material for coating to be used for the reflection, for example, a dielectric multilayer film may be used.

According to the present invention, a polarizer is used in combination with a dichroic mirror. With this combination, more laser beams can be combined compared with the case of using a dichroic mirror alone; therefore, an irradiation laser beam has higher output power. This polarizer is an element which transmits the horizontally polarized light and reflects the vertically polarized light. With this polarizer, the laser beams are combined by reflecting the vertically polarized light in the same direction as the passed horizontally polarized light. The polarizer is constituted by a thin film and a transparent base material and has a shape of a cube or a plate.

According to the present invention, a half-wave plate additionally employed when using the polarizer is set for converting the vertically polarized light into the horizontally polarized light. By passing the laser beam through the half-wave plate, the polarizing direction is rotated by 0 to 90° so that the vertically polarized light is converted into the horizontally polarized light; therefore the laser beam can pass through the polarizer. This half-wave plate is made of a birefringent material such as rock crystal or mica, and the structure and the shape are those of a flat parallel plate.

Embodiment Mode 1

The case in which three laser oscillators having three different wavelengths, two dichroic mirrors, and an apochromatic lens are used is explained below.

Figure 1:
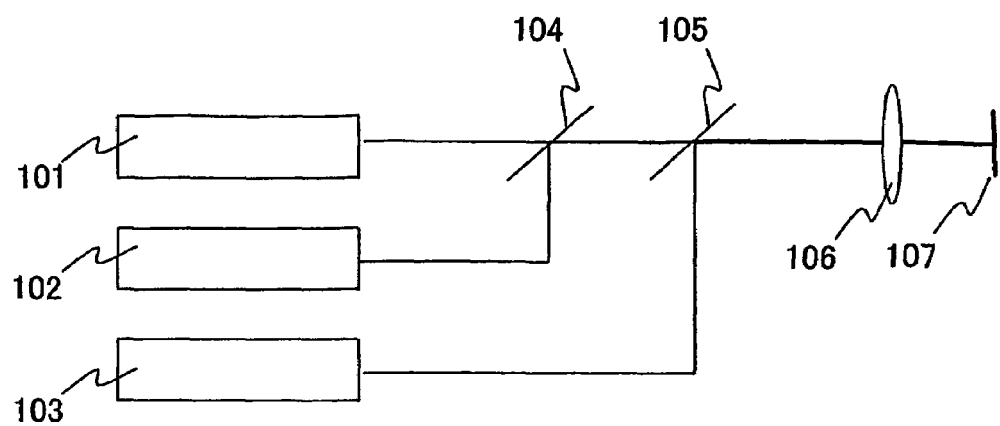
FIG. 1 is a schematic view of Embodiment Mode 1 of the present invention.

First, a mode of using three laser oscillators having different oscillation wavelengths and two dichroic mirrors each having high reflectivity against particular wavelength ranges is described with reference to FIG. 1, which is a schematic view of the mode. A laser oscillator 101 emits a laser beam having a wavelength of 446 nm (B). This laser beam is combined with a laser beam having a wavelength of 532 nm (G) emitted from a laser oscillator 102 by a dichroic mirror 104 which reflects only the wavelength range of 532 nm. After that, the laser beam combined by the dichroic mirror 104 passes through a dichroic mirror 105, and is further combined with a laser beam having a wavelength of 628 nm (R) which is emitted from a laser oscillator 103 and reflected by the dichroic mirror.

The combined laser beam having three different wavelengths, R, G, and B (hereinafter referred to as a white laser beam) is transformed into any shape by an optical system 106, and is delivered to an irradiation surface 107 on a semiconductor film. The laser beam having a wavelength of 532 nm is obtained by converting the fundamental wave (wavelength 1064 nm) of YAG, $YVO_4$, or the like into a second harmonic through a non-linear optical element. Further, the laser beam having a wavelength of 628 nm is obtained by the sum frequency mixing of a laser beam having a wavelength of 1535 nm, which has been converted from the fundamental wave by an optical parametric oscillator and a delay device, and a laser beam having a wavelength of 1064 nm through a non-linear optical element using a KTA crystal. Further, the laser beam having a wavelength of 446 nm is obtained by the sum frequency mixing of the laser beam having a wavelength of 1535 nm and the laser beam having a wavelength of 628 nm through a non-linear optical element.

Figure 2:
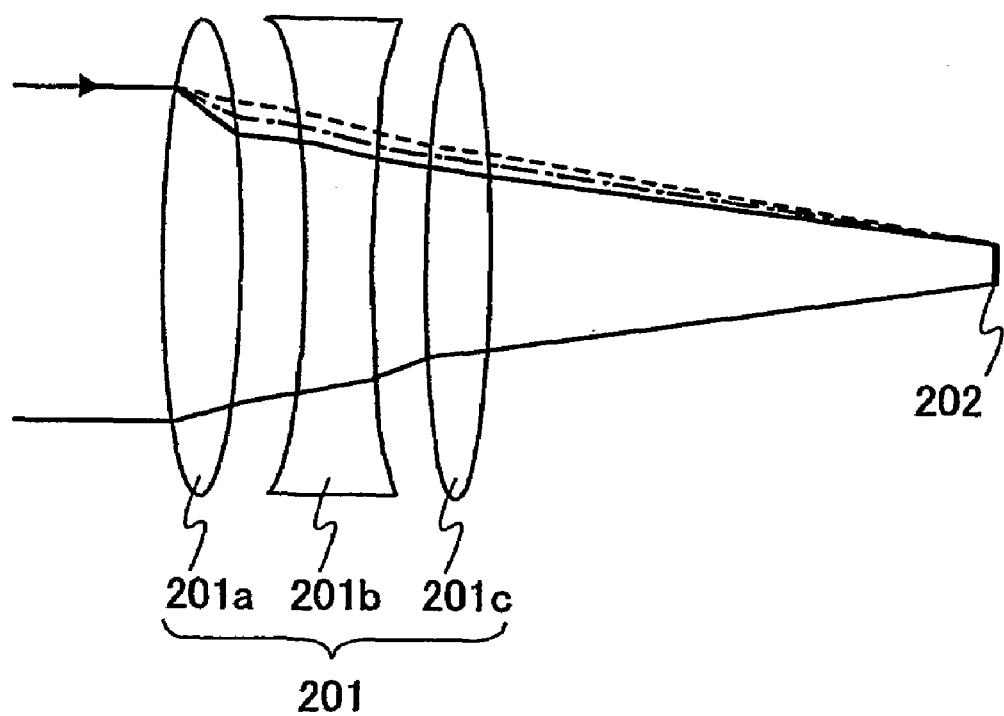
FIG. 2 shows the achromatizing function and the structure of an apochromatic lens used in the present invention.

According to the embodiment mode of the present invention, laser annealing is conducted with a white laser beam. When light having a wide wavelength range such as the white laser beam is condensed with a single lens, the focal length differs for each wavelength because of chromatic aberration. However, this problem can be solved by using an achromatizing lens which can correct the chromatic aberration. The achromatizing lens is shown in FIG. 2. The apochromatic lens is a kind of achromatizing lens which is designed to correct the chromatic aberration of light having three different wavelengths. Another achromatizing lens which can correct the chromatic aberration of light having two different wavelengths is referred to as an achromatic lens.

In FIG. 2, an apochromatic lens 201 generally comprises lenses 201a, 201b, and 201c having different refractive indexes. The apochromatic lens 201 corrects the chromatic aberration of three different wavelengths and focuses at one point of an irradiation surface 202 on a semiconductor film. In FIG. 2, an arrow illustrated with a wide solid line shows an optical path of the white laser beam. When the white laser beam enters the lens 201a, the optical path is separated into three due to the chromatic aberration as shown with three lines of a solid line, a dash dot line, and a dotted line. The chromatic aberration is corrected by the following lenses 201b and 201c, and condensed at one focal point on the irradiation surface 202. Accordingly, a laser beam having higher output power can be delivered.

Figure 3A:
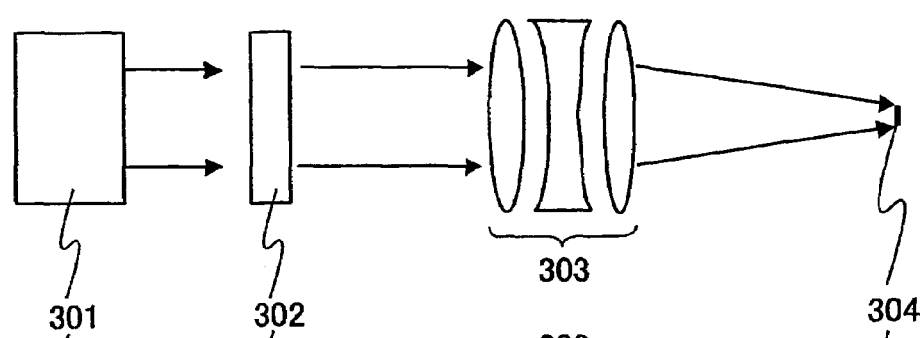
FIGS. 3A and 3B show the case of using an apochromatic lens in Embodiment Mode 1 of the present invention.
Figure 3B:
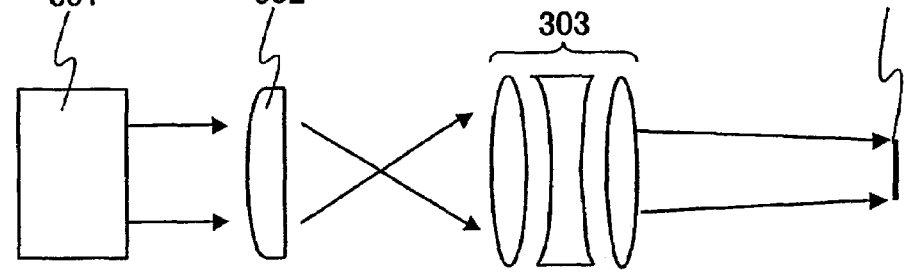

In this Embodiment Mode 1, the chromatic aberration is corrected with the apochromatic lens, and the laser beam having higher output power can be delivered. Next, an example of using the apochromatic lens and the optical system in the laser irradiation apparatus including the white laser oscillator whose schematic view is shown in FIG. 1 is described with reference to FIGS. 3A and 3B. The laser irradiation apparatus including the white laser oscillator indicates a system comprising the laser oscillators 101, 102, and 103 and the dichroic mirrors 104 and 105. FIG. 3A is a side view, and FIG. 3B is a plan view.

A laser beam emitted from a white laser oscillator 301 is condensed only in a uniaxial direction of the laser beam by a cylindrical lens 302. The laser beam condensed only in the uniaxial direction is condensed after the chromatic aberration only in a direction where the cylindrical lens 302 does not act is corrected by an apochromatic lens 303, and is delivered to an irradiation surface 304 on a semiconductor film with high output power. The semiconductor film can be irradiated with a laser beam with high output power by moving the linear beam, which has been formed by using the laser oscillator and the optical system, in a minor-axis direction of the linear beam. By manufacturing a TFT with thus obtained semiconductor film and further manufacturing a display device with the TFT according to a known method, a display device of high performance can be manufactured.

Embodiment Mode 2

The case in which four laser oscillators emitting laser beams each two of which have the same wavelength, a polarizer, three dichroic mirrors, and an achromatic lens are used in explained below.

Embodiment Mode 2 is described with reference to FIGS. 4 to 5B, which uses four laser oscillators having two oscillation wavelengths, three dichroic mirrors having high reflectivity against particular wavelength ranges, and a polarizer. In Embodiment Mode 1 described above, the three laser beams having different wavelengths are used, and the apochromatic lens is used to correct the chromatic aberration. Meanwhile, in Embodiment Mode 2, since the laser beams have two kinds of wavelengths, an achromatic lens can be used to correct the chromatic aberration and condense the combined laser beam.

Figure 4:
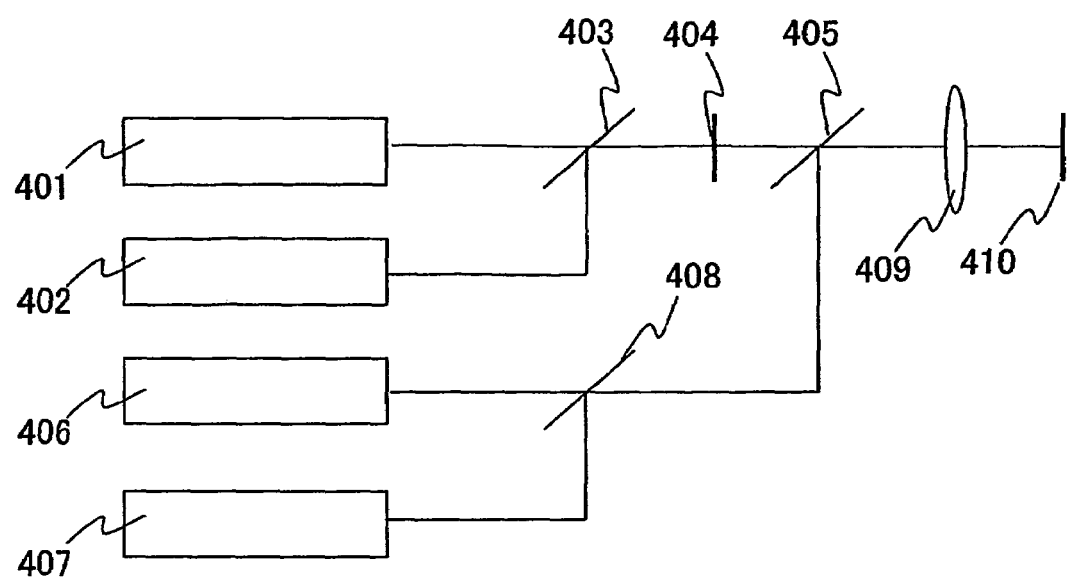
FIG. 4 is a schematic view of Embodiment Mode 2 of the present invention.

FIG. 4 is a schematic view in the case of combining laser beams with two different wavelengths emitted from four laser oscillators by two dichroic mirrors and a polarizer and condensing the laser beam by an achromatic lens. In FIG. 4, a laser beam having a wavelength of 532 nm (G) emitted from a laser oscillator 401 is combined with a laser beam having a wavelength of 355 nm (V) emitted from a laser oscillator 402 by a dichroic mirror 403 which reflects only the wavelength range of 355 nm. Since the combined laser beam is vertically polarized light, the laser beam is converted into horizontally polarized light by a half-wave plate 404, and then enters a polarizer 405. Here, the polarizer 405 is an element which transmits only the horizontally polarized light and reflects the vertically polarized light.

Similarly, a laser beam having a wavelength of 532 nm (G) emitted from a laser oscillator 406 is combined with a laser beam having a wavelength of 355 nm (V) emitted from a laser oscillator 407 by a dichroic mirror 408 which reflects only the wavelength range of 355 nm. The combined laser beam is reflected on the polarizer 405 while being remained vertically polarized, and is further combined with the horizontally polarized light. The four laser beams, which have been combined, are condensed and transformed into any shape by an optical system 409 including an achromatic lens and the like and delivered to an irradiation surface 410 on a semiconductor film. Here, the laser beam having a wavelength of 355 nm is obtained by converting the fundamental wave (wavelength of 1064 nm) of YAG, $YVO_4$, or the like into a third harmonic through a non-linear optical element. It is to be noted that the laser oscillators 406 and 407 in FIG. 4 preferably have the same wavelength as the laser oscillators 401 and 402 respectively; however, the laser oscillators 406 and 407 may emit the wavelengths different from those emitted from the laser oscillators 401 and 402.

Figure 5A:
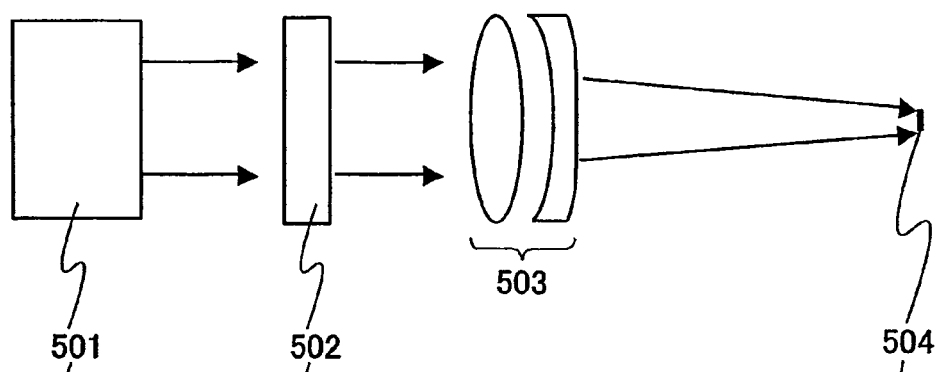
FIGS. 5A and 5B show the case of using an achromatic lens in Embodiment Mode 2 of the present invention.
Figure 5B:
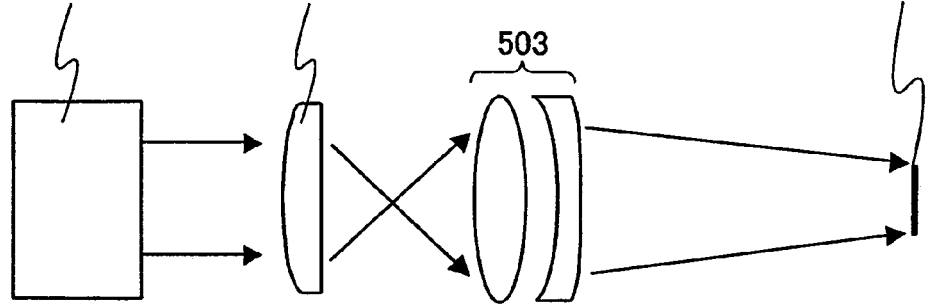

In Embodiment Mode 2 whose schematic view is shown in FIG. 4, the chromatic aberration is corrected with the achromatic lens in the optical system 409 similarly to Embodiment Mode 1 and a laser beam having higher output power can be delivered. This preferable aspect is further described with reference to FIGS. 5A and 5B. In FIGS. 5A and 5B, a laser irradiation apparatus 501 indicates a system including the laser oscillators 401, 402, 406, and 407, the dichroic mirrors 403 and 408, the half-wave plate 404, and the polarizer 405 in FIG. 4. FIG. 5A is a side view, and FIG. 5B is a plan view. A laser beam emitted from the laser irradiation apparatus 501 is condensed only in a uniaxial direction of the laser beam by a cylindrical lens 502 which acts only in the uniaxial direction.

The laser beam condensed only in the uniaxial direction is condensed again after the chromatic aberration only in a direction where the cylindrical lens 502 does not act is corrected by an achromatic lens 503, and is delivered to an irradiation surface 504 on a semiconductor film. With the laser oscillator and the optical system including the cylindrical lens and the achromatic lens, the laser beam is shaped into a linear beam, and the linear beam is moved relatively in a minor-axis direction of the linear beam on the semiconductor film. Thus, a laser beam having high output power can be delivered to the semiconductor film similarly to Embodiment Mode 1. As a result, by manufacturing a TFT with thus obtained semiconductor film and further manufacturing a display device according to a known method, a display device of high performance can be manufactured similarly to Embodiment Mode 1.

Embodiment Mode 3

The case in which six laser oscillators each two of which have the same wavelength, a polarizer, five dichroic mirrors, and an apochromatic lens are used is explained.

According to Embodiment Mode 1, the laser beams having different wavelengths emitted from the three laser oscillators are combined with plural dichroic mirrors. Further, according to Embodiment Mode 2, the laser beams having two different wavelengths emitted from the four laser oscillators are combined with plural dichroic mirrors and a polarizer. Similarly, laser beams having three different wavelengths emitted from six laser oscillators can be combined with plural dichroic mirrors and a polarizer.

Figure 6:
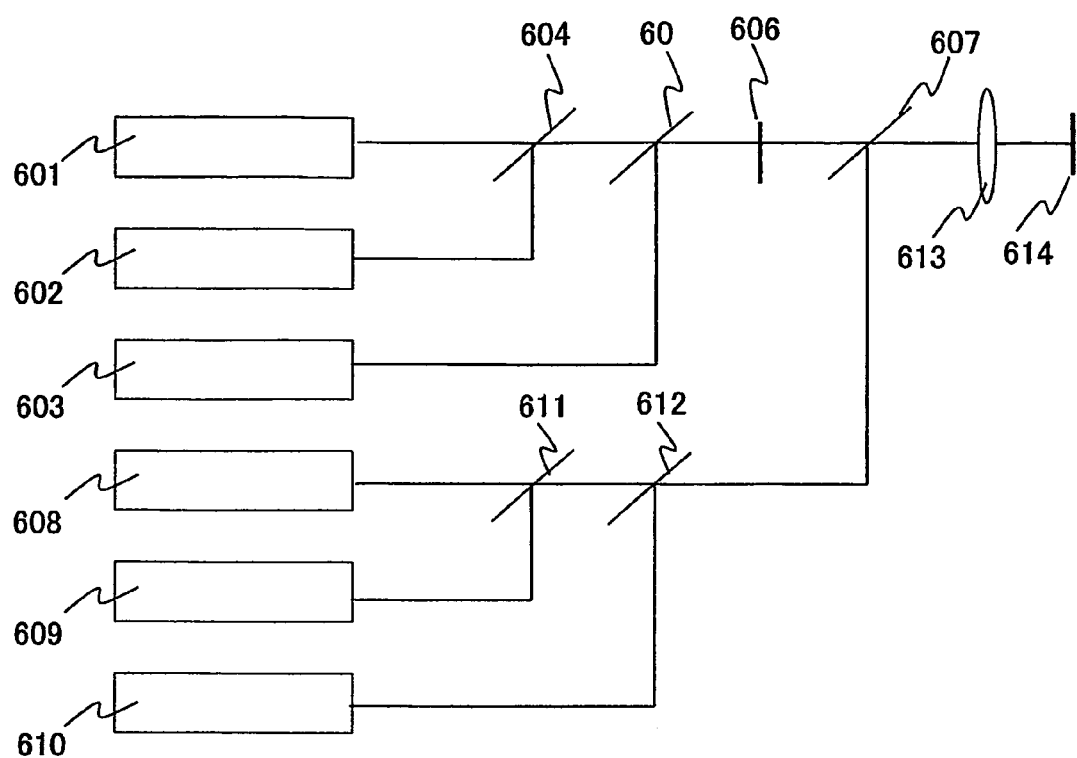
FIG. 6 is a schematic view of Embodiment Mode 3 of the present invention.

In other words, the laser beams having three different wavelengths emitted from the six laser oscillators are combined with plural dichroic mirrors, a polarizer, and an apochromatic lens, which is schematically shown in FIG. 6. In FIG. 6, a laser beam having a wavelength of 446 nm (B) emitted from a laser oscillator 601 is combined with a laser beam having a wavelength of 532 nm (G) emitted from a laser oscillator 602 by a dichroic mirror 604 which reflects only the wavelength range of 532 nm. The laser beam combined by the dichroic mirror 604 is further combined with a laser beam having a wavelength of 628 nm (R) emitted from a laser oscillator 603 by a dichroic mirror 605.

Since the combined laser beam is vertically polarized light, the laser beam is converted into horizontally polarized light by a half-wave plate 606 and then enters a polarizer 607; thus the laser beam passes through the polarizer 607. Similarly, a laser beam having a wavelength of 446 nm (B) emitted from a laser oscillator 608 is combined with a laser beam having a wavelength of 532 nm (G) emitted from a laser oscillator 609 by a dichroic mirror 611 which reflects only the wavelength range of 532 nm. Further, the laser beam combined by the dichroic mirror 604 is further combined with a laser beam having a wavelength of 628 nm (R) emitted from a laser oscillator 610 by a dichroic mirror 612. After that, the combined laser beam is reflected on a polarizer 607 while being remained vertically polarized, and is combined with the horizontally polarized laser beam which has passed through the polarizer 607. In FIG. 6, the laser oscillators 608, 609, and 610 have the same wavelength as the laser oscillators 601, 602, and 603 respectively, and this is preferable. However, the wavelengths of the former laser oscillators 608, 609, and 610 may be different from those of the latter ones.

The six laser beams, which have been combined, may be transformed into any shape by an optical system 613, and is delivered to an irradiation surface 614 on a semiconductor film. The optical system 613 may be the same as the optical system including the apochromatic lens described in Embodiment Mode 1. By shaping the laser beam emitted from the laser oscillator into a linear beam by the optical system and moving the semiconductor film relatively in a minor-axis direction of the linear beam, the semiconductor film can be irradiated with the laser beam having high output power. By manufacturing a TFT with thus obtained semiconductor film and further manufacturing a display device with this TFT according to a known method, a display device of high performance can be manufactured.

These embodiment modes use a spherical apochromatic or achromatic lens to correct the chromatic aberration only in the minor-axis direction of the linear beam. When the laser beam is condensed in the major-axis direction and the minor-axis direction with cylindrical achromatizing lenses each of which acts only in a uniaxial direction, the chromatic aberration can also be corrected in the major-axis direction. Further, when plural laser oscillators are used, the divergence angle or the beam diameter of the laser beams emitted from the laser oscillators differ respectively. Consequently, the cylindrical achromatizing lenses are designed so that the laser beams do not have the same focal length but have the same spot diameter on the irradiation surface. Thus, it becomes possible to align the beam length in its major-axis direction. This case is illustrated in FIG. 7.

Figure 7:
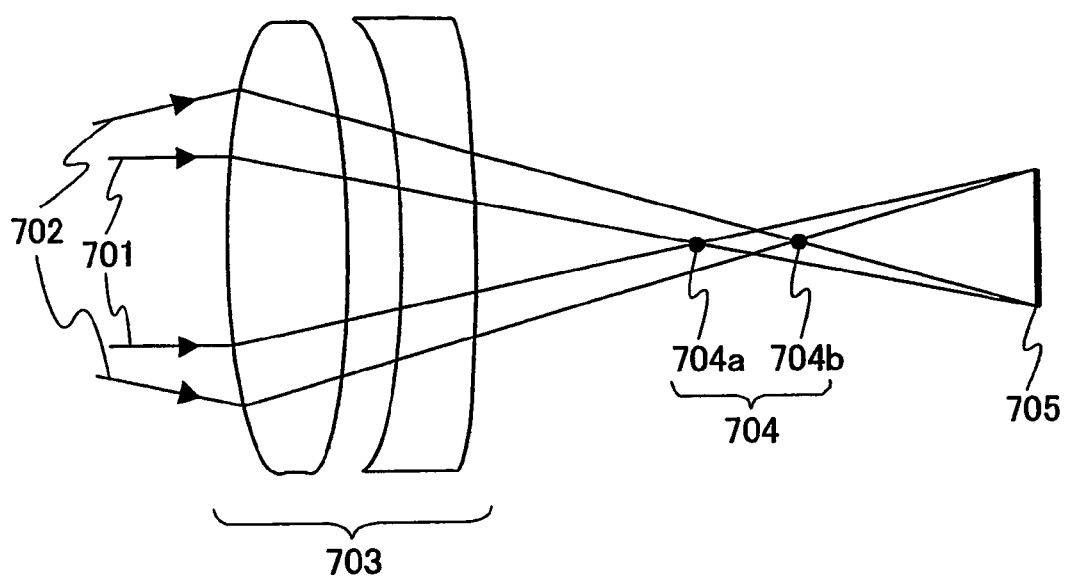
FIG. 7 shows the achromatizing function and the structure of a cylindrical achromatic lens applicable in the present invention.

FIG. 7 shows an example of combining laser beams on an irradiation surface 705 with a laser beam 701 having a wavelength of 446 nm and a laser beam 702 having a wavelength of 628 nm using a cylindrical achromatic lens 703. In the example shown in FIG. 7, the beam diameter and the beam divergence angle of the laser beams 701 and 702 are different. The cylindrical achromatic lens 703 is designed so that the laser beams 701 and 702 with different wavelengths have the same beam length on the irradiation surface 705. For this reason, although the laser beams 701 and 702 have their focal points 704a and 704b at different positions, the same spot on the irradiation surface 705 is irradiated. When three laser beams having different wavelengths are used, a cylindrical apochromatic lens may be used instead of the cylindrical achromatic lens and designed similarly.

In Embodiment Modes 1 to 3, which are the best mode for carrying out the present invention, three or more laser beams are combined. However, the present invention is also applicable in the case of combining two laser beams. In such a case, it is not necessary to use the half-wave plate as the conventional case that uses the polarizer and the change to the combination of three or more laser beams can be easily conducted. At this time, there is an advantage that a dichroic mirror can also be used. Further, as the laser oscillator in the present invention, it is preferable to use a CW laser oscillator in consideration of the purport of the present invention; however, the present invention is not limited to this, and a non-continuous wave laser emitted from an excimer laser can also be used. For example, a pulsed laser having a repetition frequency of 10 MHz or more, preferably 80 MHz or more, may be used. It is said that it takes several tens to several hundred ns to solidify a semiconductor film after irradiating the semiconductor film with a pulsed laser beam. With the laser beam having the above repetition frequency, the pulsed laser beam can be delivered after the semiconductor film is melted by the previous laser beam and before the semiconductor film is solidified. Therefore, unlike the case of using the conventional pulsed laser, it is possible to move the interface between the solid phase and the liquid phase continuously in the semiconductor film. Accordingly, a semiconductor film having a crystal grain grown continuously in the scanning direction is formed.

Embodiment 1

Figure 8A:
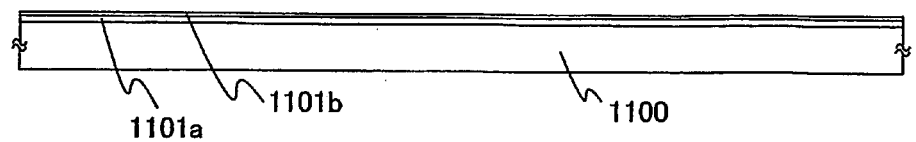
FIGS. 8A to 8D show a method for manufacturing a semiconductor device of the present invention using a laser irradiation method of the present invention.

This embodiment describes a method for manufacturing a semiconductor device according to the present invention using a laser irradiation method and a laser irradiation apparatus of the present invention with reference to FIGS. 8A to 9C. It is to be noted that, in addition to the mode of this embodiment, other modes which can be applied to the manufacturing process are also described. First, base insulating films 1101a and 1101b are formed over a substrate 1100 (FIG. 8A). A glass substrate is used substrate 1100 in this embodiment. As other materials of the substrate 1100, an insulating substrate such as a glass substrate, a quartz substrate, or a crystalline glass substrate, a ceramic substrate, a stainless steel substrate, a metal substrate (such as tantalum, tungsten, molybdenum, or the like), a semiconductor substrate, or a plastic substrate (such as polyimide, acrylic, polyethylene terephthalate, polycarbonate, polyarylate, or polyethersulfone) can be used. The substrate is formed with the material that can resist at least the heat generated in the process.

As the base insulating films, in this embodiment, a silicon nitride oxide film is formed in 50 nm thick as a first base insulating film 1101a, and a silicon oxynitride film is formed in 100 nm thick as a second base insulating film 1101b. These films are formed by a known method such as a sputtering method, a reduced-pressure CVD method, or a plasma CVD method. Although the base insulating films are formed in a two-layer structure in the present embodiment, the base insulating film may be formed in a single-layer structure or in a multilayer structure of three or more layers. It is to be noted that the silicon nitride oxide film and the silicon oxynitride film are different in the proportion between nitrogen and oxygen. The former contains more nitrogen than the latter.

Figure 8B:
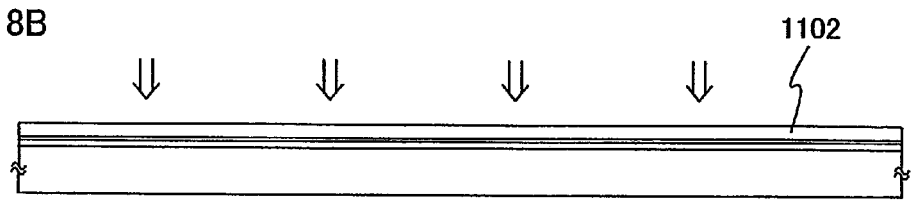

Next, an amorphous semiconductor film 1102 is formed over the insulating film. In this embodiment, amorphous silicon is formed in 66 nm thick by a CVD method. The amorphous semiconductor film may be formed with silicon or a silicon-based material (for example, $Si_xGe_{1-x}$) in thickness from 25 to 80 nm by a known method such as the sputtering method, the reduced-pressure CVD method, or the plasma CVD method. After that, the amorphous silicon is crystallized (FIG. 8B).

In the present embodiment, laser irradiation method and apparatus of the present invention are used to perform laser annealing. Therefore, laser beams with different wavelengths that are emitted from three or more laser oscillators are combined, and the laser annealing is performed with the combined laser beam. Specifically, as shown in Embodiment Mode 1, the three laser beams having different wavelengths emitted from the three laser oscillators are combined by the dichroic mirrors. Then, the amorphous silicon film is irradiated with the combined laser beam, and crystallization is performed with higher productivity. After the crystallization by the laser annealing, etching is performed to form crystalline semiconductor layers 1102a to 1102d having desired shapes.

Figure 8C:
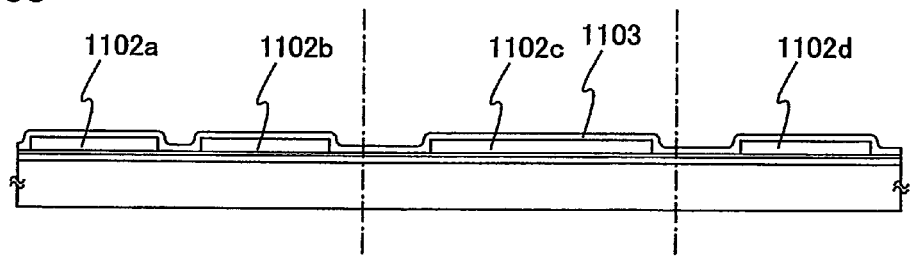
Figure 8D:
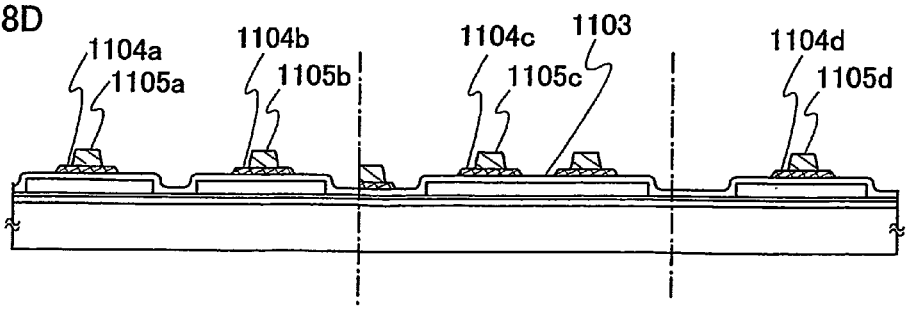

Subsequently, a silicon oxide film is formed as a gate insulating film 1103 in this embodiment (FIG. 8C). The film thickness thereof is set to approximately 115 nm, and an insulating film including silicon may be formed by the low-pressure CVD method, the plasma CVD method, the sputtering method, or the like. Next, a tantalum nitride (TaN) film having a thickness of 30 nm is formed over the gate insulating film as first conductive layers 1104a to 1104d, and a tungsten (W) film having a thickness of 370 nm is formed thereover as second conductive layers 1105a to 1105d.

The TaN film may be formed by the sputtering method using Ta as a target in the atmosphere of nitrogen, while the W film may be formed by the sputtering method using W as a target. Although this embodiment forms the first conductive layer using TaN in 30 nm thick and the second conductive layer using W in 370 nm thick, the materials of these conductive layers are not limited to these elements. Both of the first and the second conductive layers may be formed with the element selected from the group consisting of Ta, W, Ti, Mo, Al, Cu, Cr and Nd, or a compound material or an alloy material including the above element as its main component.

In addition, a semiconductor film, typically a poly-crystalline silicon film, doped with an impurity such as phosphorus may be also employed as the first and second conductive layers. Moreover, AgPdCu alloy can be also used as the first and second conductive layers. Furthermore, the combination of these may be selected appropriately. The film thickness of the first conductive layer is preferably in the range of 20 to 100 nm, and that of the second conductive layer is preferably in the range of 100 to 400 nm. Although the present embodiment shows the two-layer structure, the conductive layer may be formed in a single-layer structure or a multilayer structure of three or more layers.

Figure 9A:
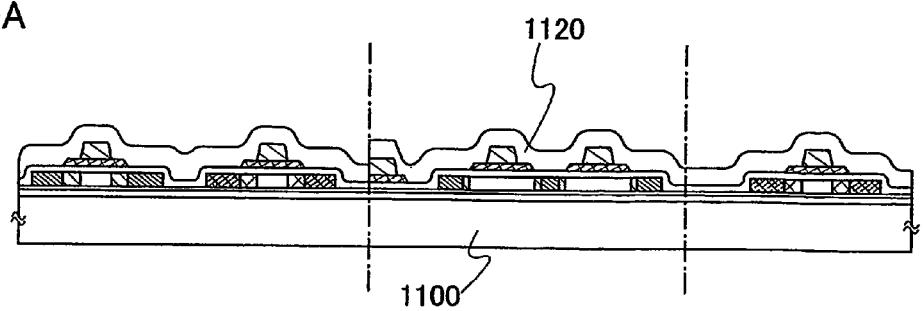
FIGS. 9A to 9C show a method for manufacturing a semiconductor device of the present invention using a laser irradiation method of the present invention.

Next, by using a gate electrode or a patterned resist as a mask, an impurity imparting n-type or p-type conductivity is selectively added to the semiconductor films 1102a to 1102d so that a source region, a drain region, an LDD region, and the like are formed. After that, the resist mask is removed, and then a first passivation film 1120 is formed (FIG. 9A). In this embodiment, a silicon oxynitride film is formed in 100 nm thick by a plasma CVD method. It is to be noted that an insulating film including silicon may be formed as the first passivation film in thickness of 100 to 200 nm by the plasma CVD method or the sputtering method.

At this time, a silicon oxynitride film manufactured with $SiH_4$, $N_2O$, and $NH_3$ or a silicon oxynitride film manufactured with $SiH_4$ and $N_2O$ may be formed by the plasma CVD method. These silicon oxynitride films can be manufactured under the condition where the reaction pressure is set in the range of 20 to 200 Pa, the substrate temperature is set in the range of 300 to 400° C., and electrical power density is set in the range of 0.1 to 1.0 $W/cm^2$ at high frequency (60 MHz). In addition, a silicon oxynitride hydride film manufactured with $SiH_4$, $N_2O$, and $H_2$ may be applied as the first passivation film. Of course, the first passivation film 1120 may be formed not only in the single-layer structure of the silicon oxynitride film as shown in this embodiment, but also in the single-layer structure of other insulating film including silicon or in the multilayer structure.

After that, the laser annealing method is performed to recover the crystallinity of the semiconductor layer and to activate the impurity element added in the semiconductor layers. In this case, laser beams having different wavelengths emitted from three or more laser oscillators are combined by dichroic mirrors or dichroic mirrors plus a polarizer. Thus, the combined laser beams that can improve productivity further with high output power is irradiated to the semiconductor layer. Further, by performing heat treatment after forming the first passivation film 1120, hydrogenation of the semiconductor layers can be performed simultaneously with the activation process. The hydrogenation is to terminate dangling bonds in the semiconductor layers with hydrogen included in the first passivation film.

Alternatively, the heat treatment may be performed before the first passivation film 1120 is formed. However, when the materials of the first conductive layers 1104a to 1104d and the second conductive layers 1105a to 1105d are sensitive to heat, the heat treatment is preferably performed after forming the passivation film in order to protect wirings and the like as shown in the present embodiment. When the heat treatment is performed before forming the passivation film 1120, the hydrogenation utilizing the hydrogen included in the passivation film cannot be performed because the passivation film does not exist in the heat treatment. In this case, the hydrogenation is performed by using hydrogen excited in plasma (plasma hydrogenation) or by heat treatment in the atmosphere including hydrogen by 3 to 100% at temperatures ranging from 300 to 450° C. for 1 to 12 hours.

Figure 9B:
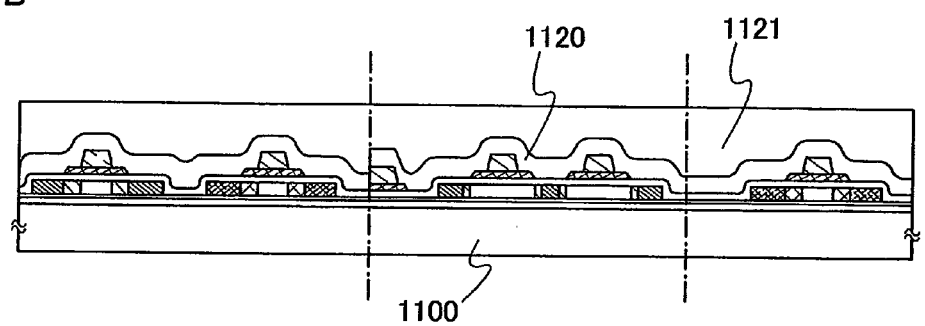

Next, a first interlayer insulating film 1121 is formed over the first passivation film 1120 (FIG. 9B). A non-photosensitive acrylic film is formed in 1.6 μm thick in this embodiment (FIG. 9B). An inorganic insulating film or an organic insulating film may be used as the first interlayer insulating film. A silicon oxide film formed by the CVD method or a silicon oxide film applied by an SOG (Spin On Glass) method can be used as the inorganic insulating film. A film of polyimide, polyamide, BCB (benzocyclobutene), acrylic, positive photosensitive organic resin, negative photosensitive organic resin, or the like can be used as the organic insulating film. A multilayer structure of an acrylic film and a silicon oxynitride film may also be used.

Siroxane-based polymer can be used as the interlayer insulating film. Siloxane has the skeletal structure that is formed with a bond of silicon (Si) and oxygen (O). An organic group (for example alkyl group or aromatic carbon hydride) that includes at least hydrogen is applied as the substituent. A fluoro group may also be used as the substituent. An organic group that includes at least hydrogen and a fluoro group may be used as the substituent. As the siloxane-based polymer, there are silica glass, alkylsiloxane polymer, alkylsilsesquioxane polymer, silsesquioxane hydride polymer, alkylsilsesquioxane hydride polymer, and the like according to their structures. Further, the interlayer insulating film may be formed with the material including polymer having a Si—N bond (polysilazane).

Although the interlayer insulating film is made so thinly, the interlayer insulating film can maintain its enough flatness and high insulating characteristic by employing the above material. For this reason, the first interlayer insulating film can relax and flatten the unevenness due to the TFT formed over the substrate. Since the first interlayer insulating film is formed particularly for the purpose of flattening, it is preferable to use the insulating film formed of the material that can be easily flattened. Moreover, because the above material has high resistance against the heat, the interlayer insulating film that can resist through a reflow process in a multilayer wiring can be obtained. Furthermore, because it has low moisture-absorption characteristic, it is possible to form the interlayer insulating film having less dewatering volume.

After that, a second passivation film may be formed with a silicon nitride oxide film or the like over the first interlayer insulating film. In this embodiment, a silicon oxynitride film is formed in 70 nm thick by the RF sputtering method. The film thickness is preferably in the range of approximately 10 to 200 nm, and the second passivation film prevents the moisture from entering the first interlayer insulating film. Besides, a silicon nitride film, an aluminum nitride film, an aluminum oxynitride film, a diamond-like carbon (DLC) film, or a carbon nitride (CN) film can be used similarly as the second passivation film.

The film formed by an RF sputtering method is a highly dense film and is superior in the barrier properties. In the case of forming a silicon oxynitride film, for example, the RF sputtering is performed under the condition where Si is used as a target, $N_2$, Ar, and $N_2O$ are flowed at gas flow rate of 31:5:4, the pressure is set to 0.4 Pa, and the electric power is set to 3000 W. In the case of forming a silicon nitride film, for example, Si is used as a target, $N_2$ an Ar are flowed at gas flow rate of 1:1 in the chamber, the pressure is set to 0.8 Pa, the electric power is set to 3000 W, and the film-forming temperature is set to 215° C.

Subsequently, the second passivation film, the first interlayer insulating film, and the first passivation film are etched to form contact holes that reach the source and drain regions. After that, wirings and electrodes to connect electrically with the respective source and drain regions are formed. It is to be noted that these wirings are formed by patterning a multilayer of a 50-nm-thick Ti film and a 500-nm-thick alloy film (aluminum (Al) and titanium (Ti)). The wirings may be formed not only in a two-layer structure but also in a single-layer structure or in a multilayer structure of three or more layers. In addition, the wiring materials are not limited to Al and Ti. For example, the wirings may be formed by patterning a multilayer in which an aluminum (Al) film or a copper (Cu) film is formed over the TaN film and a Ti film is further formed thereover.

Figure 9C:
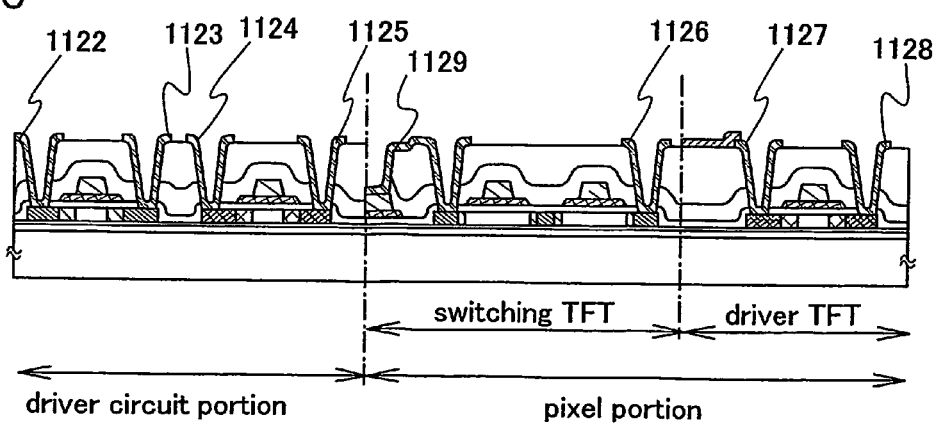

According to the above steps, a semiconductor device shown in FIG. 9C is completed. The manufacturing method of the semiconductor device using the laser annealing method according to the present invention is not limited to the method for manufacturing a TFT described above. This embodiment can be freely combined with any one of the above embodiment modes and embodiments.

Embodiment 2

As electronic appliances incorporating semiconductor devices manufactured by the manufacturing method according to the present invention with the use of the laser annealing method of the present invention, there are a camera such as a video camera and a digital camera, a goggle-type display (head mount display), a navigation system, a sound reproduction device (a car audio, an audio compo, and the like), a computer, a game machine, a mobile information terminal (a mobile computer, a mobile phone, a mobile game machine, an electronic book, and the like), an image reproduction device equipped with a recording medium (specifically a DVD (digital versatile disc)), and the like, all of which are devices for reproducing recording media and have displays for displaying the image.

Figure 10A:
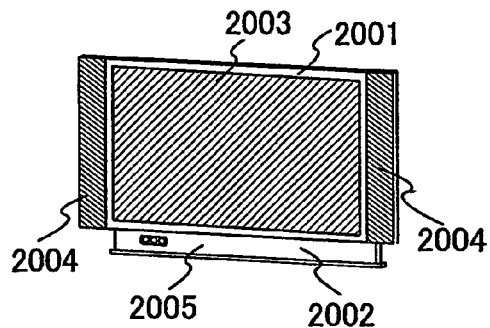
FIG. 10A to 10H show electronic appliances incorporating semiconductor devices manufactured by a method for manufacturing a semiconductor device of the present invention.
Figure 10B:
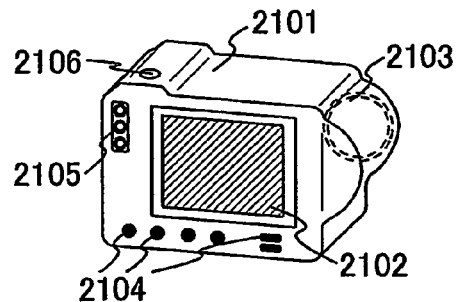

FIGS. 10A to 10H show specific examples of these electronic appliances. FIG. 10A shows a television receiving machine including a case 2001, a supporting stand 2002, a display portion 2003, speaker portions 2004, a video input terminal 2005, and the like. The television receiving machine can be manufactured by using a semiconductor device manufactured using a laser irradiation method according to the present invention in the display portion 2003. FIG. 10B shows a digital camera including a main body 2101, a display portion 2102, an image receiving portion 2103, operation keys 2104, an external connection port 2105, a shutter 2106, and the like. The digital camera can be manufactured by using a semiconductor device manufactured using a laser irradiation method according to the present invention in the display portion 2102, circuits, and the like.

Figure 10C:
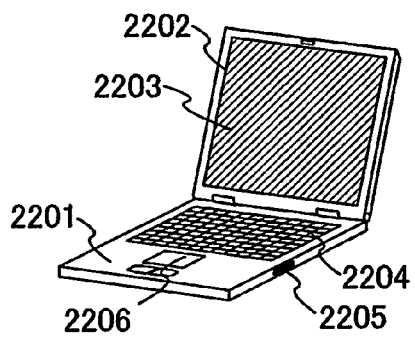
Figure 10D:
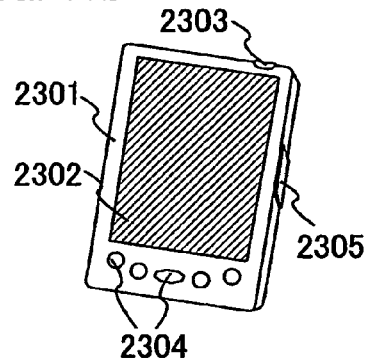

FIG. 10C shows a computer including a main body 2201, a case 2202, a display portion 2203, a keyboard 2204, an external connection port 2205, a pointing mouse 2206, and the like. The computer can be manufactured by using a semiconductor device manufactured using a laser irradiation method according to the present invention in the display portion 2203, circuits, and the like. FIG. 10D shows a mobile computer including a main body 2301, a display portion 2302, a switch 2303, operation keys 2304, an infrared port 2305, and the like. The mobile computer can be manufactured by applying a laser irradiation method according to the present invention to the process of the display portion 2302, circuits, and the like.

Figure 10E:
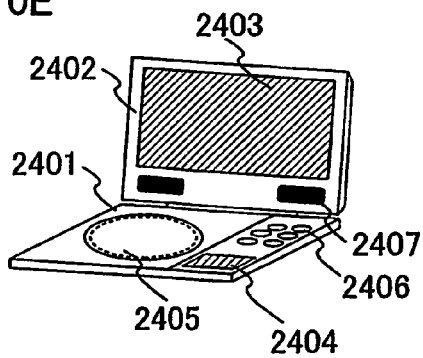

FIG. 10E shows a mobile image reproduction device equipped with a recording medium (for example a DVD reproduction device), including a main body 2401, a case 2402, a display portion A 2403, a display portion B 2404, a recording medium (such as a DVD) reading portion 2405, operation keys 2406, speaker portions 2407, and the like. The display portion A 2403 mainly displays image information, while the display portion B 2404 mainly displays text information. The image reproduction device can be manufactured by applying a laser irradiation method according to the present invention to the process of the display portions A 2403 and B 2404, circuits, and the like. It is to be noted that the image reproduction device equipped with the recording medium includes a game machine and the like.

Figure 10F:
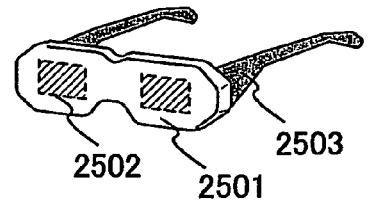
Figure 10G:
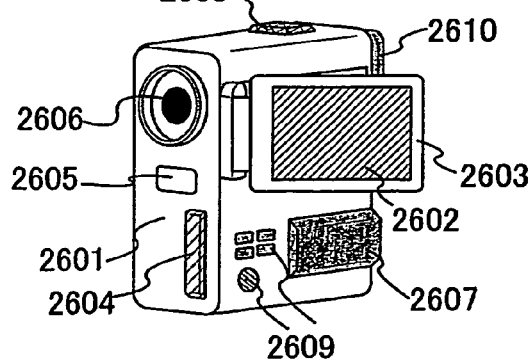

FIG. 10F shows a goggle type display (a head mount display) including a main body 2501, a display portion 2502, and an arm portion 2503. The goggle type display can be manufactured by applying a laser irradiation method according to the present invention to the process of the display portion 2502, circuits, and the like. FIG. 10G shows a video camera including a main body 2601, a display portion 2602, a case 2603, an external connection port 2604, a remote control receiving portion 2605, an image receiving portion 2606, a battery 2607, an audio input portion 2608, operation keys 2609, an eyepiece portion 2610, and the like. The video camera can be manufactured by applying a laser irradiation method according to the present invention to the process of the display portion 2602, circuits, and the like.

Figure 10H:
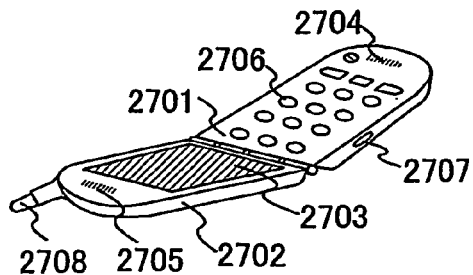

FIG. 10H shows a mobile phone including a main body 2701, a case 2702, a display portion 2703, an audio input portion 2704, an audio output portion 2705, operation keys 2706, an external connection port 2707, an antenna 2708, and the like. The mobile phone can be manufactured by applying a laser irradiation method according to the present invention to the display portion 2703, circuits, and the like. In addition to the above electronic appliances, the present invention can be applied to a front-type or rear-type projector. As thus described, the present invention can be applied in a wide range, and can be applied to electronic appliances of every field.

EXPLANATION OF REFERENCE

101: LASER OSCILLATOR, 102: LASER OSCILLATOR, 103: LASER OSCILLATOR, 104: DICHROIC MIRROR, 105: DICHROIC MIRROR, 106: OPTICAL ELEMENT, 107: IRRADIATION SURFACE, 201: APOCHROMATIC LENS, 201*a*: LENS, 201*b*: LENS, 201*c*: LENS, 202: IRRADIATION SURFACE, 300: SUBSTRATE TEMPERATURE, 301: WHITE LASER OSCILLATOR, 302: CYLINDRICAL LENS, 303: APOCHROMATIC LENS, 304: IRRADIATION SURFACE, 401: LASER OSCILLATOR, 403: DICHROIC MIRROR, 404: HALFWAVE PLATE, 405: POLARIZER, 408: DICHROIC MIRROR, 409: OPTICAL ELEMENT, 410: IRRADIATION SURFACE, 501: LASER OSCILLATOR, 502: CYLINDRICAL LENS, 503: ACHROMATIC LENS, 504: IRRADIATION SURFACE, 604: DICHROIC MIRROR, 605: DICHROIC MIRROR, 606: HALFWAVE PLATE, 607: POLARIZER, 611: DICHROIC MIRROR, 612: DICHROIC MIRROR, 613: OPTICAL ELEMENT, 614: IRRADIATION SURFACE, 701: LASER BEAM, 702: LASER BEAM, 703: CYLINDRICAL APOCHROMATIC LENS, 704*a*: FOCAL POINT, 704*b*: FOCAL POINT, 705: IRRADIATION SURFACE, 1100: SUBSTRATE, 1120: PASSIVATION FILM, 1121: INTERLAYER INSULATING FILM, 2001: CASE, 2002: SUPPORTING STAND, 2003: DISPLAY PORTION, 2004: SPEAKER PORTIONS, 2005: VIDEO INPUT TERMINAL, 2101: MAIN BODY, 2102: DISPLAY PORTION, 2103: IMAGE RECEIVING PORTION, 2104: OPERATION KEYS, 2105: EXTERNAL CONNECTION PORT, 2106: SHUTTER, 2201: MAIN BODY, 2202: CASE, 2203: DISPLAY PORTION, 2204: KEYBOARD, 2205: EXTERNAL CONNECTION PORT, 2206: POINTING MOUSE, 2301: MAIN BODY, 2302: DISPLAY PORTION, 2303: SWITCH, 2304: OPERATION KEYS, 2305: INFRARED PORT, 2401: MAIN BODY, 2402: CASE, 2403: DISPLAY PORTION A, 2404: DISPLAY PORTION B, 2405: RECORDING MEDIUM READING PORTION, 2406: OPERATION KEYS, 2407: SPEAKER PORTIONS, 2501: MAIN BODY, 2502: DISPLAY PORTION, 2503: ARM PORTIONS, 2601: MAIN BODY, 2602: DISPLAY PORTION, 2603: CASE, 2604: EXTERNAL CONNECTION PORT, 2605: REMOTE CONTROL RECEIVING PORTION, 2606: IMAGE RECEIVING PORTION, 2607: BATTERY, 2608: AUDIO INPUT PORTION, 2609: OPERATION KEYS, 2610: EYEPIECE PORTION, 2701: MAIN BODY, 2702: CASE, 2703: DISPLAY PORTION, 2704: AUDIO INPUT PORTION, 2705: AUDIO OUTPUT PORTION, 2706: OPERATION KEYS, 2707: EXTERNAL CONNECTION PORT, 2708: ANTENNA, 1100*a*: INSULATING FILM, 1100*b*: INSULATING FILM, 1101*a*: BASE INSULATING FILM, 1102*a*: SEMICONDUCTOR FILM, 1104*a*: CONDUCTIVE LAYER, 1105*a*: CONDUCTIVE LAYER

The invention claimed is:

1. A manufacturing method for a semiconductor device comprising:
    emitting a first laser beam from a first laser oscillator;
    emitting a second laser beam from a second laser oscillator;
    passing the first laser beam through a dichroic mirror and reflecting the second laser beam at the dichroic mirror so that the first laser beam and the second laser beam have a same optical axis;
    passing the first laser beam and the second laser beam having the same optical axis through a cylindrical achromatic lens so that the first laser beam and the second laser beam have a same beam length on a surface of a semiconductor film;
    crystallizing the semiconductor film by irradiating the semiconductor film with the first laser beam and the second laser beam having the same optical axis and the same beam length,
    wherein wavelength of the first laser beam is different from that of the second laser beam, and
    wherein a focal point of the first laser beam is different from that of the second laser beam.

2. The method according to claim 1, wherein the semiconductor device is incorporated into an electronic appliance selected from the group consisting of a video camera, a digital camera, a goggle-type display, a navigation system, a car audio, an audio compo, a computer, a game machine, a mobile computer, a mobile phone, a mobile game machine, an electronic book, and an image reproduction device.

3. A manufacturing method for a semiconductor device comprising:
    emitting a first laser beam from a first laser oscillator;
    emitting a second laser beam from a second laser oscillator;
    emitting a third laser beam from a third laser oscillator;
    passing the first laser beam through a first dichroic mirror and reflecting the second laser beam at the first dichroic mirror so that the first laser beam and the second laser beam have a same optical axis;
    passing the first laser beam and the second beam having the same optical axis through a second dichroic mirror and reflecting the third laser beam at the second dichroic mirror so that the first laser beam and the second laser beam having the same optical axis and the third laser beam have the same optical axis;

passing the first laser beam, the second laser beam and the third laser beam having the same optical axis through a cylindrical apochromatic lens so that the first laser beam, the second laser beam and the third laser beam have a same beam length on a surface of a semiconductor film;

crystallizing the semiconductor film by irradiating the semiconductor film with the first laser beam, the second laser beam and the third laser beam having the same optical axis and the same beam length, wherein wavelengths of the first, second, third laser beams are different from each other, and wherein a focal point of the first laser beam, that of the second laser beam and that of the third laser beam are different from one another.

4. The method according to claim 3, wherein the semiconductor device is incorporated into an electronic appliance selected from the group consisting of a video camera, a digital camera, a goggle-type display, a navigation system, a car audio, an audio compo, a computer, a game machine, a mobile computer, a mobile phone, a mobile game machine, an electronic book, and an image reproduction device.

5. The method according to claim 1, wherein each of the first laser beam and the second laser beam is a continuous wave laser beam.

6. The method according to claim 3, wherein each of the first laser beam, the second laser beam and the third laser beam is a continuous wave laser beam.

7. The method according to claim 1, further comprising:
etching the crystallized semiconductor film to form crystallized semiconductor layers having desired shapes;
forming a gate insulating film over the crystallized semiconductor layers;
forming a gate electrode over the gate insulating film.

8. The method according to claim 3, further comprising:
etching the crystallized semiconductor film to form crystallized semiconductor layers having desired shapes;
forming a gate insulating film over the crystallized semiconductor layers;
forming a gate electrode over the gate insulating film.

* * * * *